(12) United States Patent
Liscidini et al.

(10) Patent No.: US 9,048,783 B2
(45) Date of Patent: Jun. 2, 2015

(54) RECONFIGURABLE VOLTAGE CONTROLLED OSCILLATOR FOR SUPPORTING MULTI-MODE APPLICATIONS

(71) Applicant: Marvell World Trade Ltd., St. Michael (BB)

(72) Inventors: Antonio Liscidini, Toronto (CA); Luca Fanori, Pavia (IT); Rinaldo Castello, Arcore (IT); Alessandro Venca, Tortona (IT)

(73) Assignee: Marvell World Trade Ltd., St. Michael (BB)

( * ) Notice: Subject to any disclaimer, the term of this patent is extended or adjusted under 35 U.S.C. 154(b) by 40 days.

(21) Appl. No.: 13/776,944

(22) Filed: Feb. 26, 2013

(65) Prior Publication Data

US 2013/0222070 A1 Aug. 29, 2013

Related U.S. Application Data

(60) Provisional application No. 61/604,657, filed on Feb. 29, 2012.

(51) Int. Cl.
| | |
|---|---|
| *H03B 5/08* | (2006.01) |
| *H03B 5/18* | (2006.01) |
| *H03B 28/00* | (2006.01) |
| *H03B 5/00* | (2006.01) |
| *H03B 5/12* | (2006.01) |

(52) U.S. Cl.
CPC ........ *H03B 28/00* (2013.01); *H03B 5/00* (2013.01); *H03B 5/12* (2013.01); *H03B 5/1212* (2013.01); *H03B 5/1228* (2013.01); *H03B 5/1215* (2013.01); *H03B 2200/0046* (2013.01); *H03B 2200/0054* (2013.01); *H03B 2200/0082* (2013.01); *H03B 2200/0086* (2013.01); *H03B 5/1225* (2013.01); *H03B 5/1234* (2013.01)

(58) Field of Classification Search
CPC .......... H03B 5/00; H03B 5/12; H03B 5/1212; H03B 5/1215; H03B 28/00; H03B 5/1228; H03B 5/1225; H03B 5/1234; H03B 2200/0054; H03B 2200/0082; H03B 2200/0086
USPC ........... 331/49, 167, 117 R, 117 FE, 2, 46, 48
See application file for complete search history.

(56) References Cited

U.S. PATENT DOCUMENTS

| | | |
|---|---|---|
| 2009/0289732 A1 | 11/2009 | Miyashita |
| 2010/0321124 A1 | 12/2010 | Rangarajan et al. |

OTHER PUBLICATIONS

International Search Report and Written Opinion dated Jul. 30, 2013 in International Application No. PCT/IB2013/000669.

*Primary Examiner* — Arnold Kinkead
*Assistant Examiner* — Richard Tan

(57) ABSTRACT

In accordance with an embodiment of the disclosure, circuits and methods are provided for using a reconfigurable voltage controlled oscillator to support multi-mode applications. A voltage control oscillator circuit comprises a resonant circuit, a first oscillator circuitry coupled to the resonant circuit, and a second oscillator circuitry coupled to the resonant circuit. The voltage control oscillator circuit further comprises switching circuitry configured to select, based on an operating metric, one of the first oscillator circuitry and the second oscillator circuitry for providing an output voltage.

18 Claims, 7 Drawing Sheets

US 9,048,783 B2

RECONFIGURABLE VOLTAGE CONTROLLED OSCILLATOR FOR SUPPORTING MULTI-MODE APPLICATIONS

CROSS-REFERENCE TO RELATED APPLICATION

This application claims the benefit under 35 U.S.C. §119 (e) of U.S. Provisional Application No. 61/604,657, filed Feb. 29, 2012, which is hereby incorporated by reference herein in its entirety.

FIELD OF USE

The present disclosure relates generally to oscillator circuits and methods, and more particularly, to circuits and methods for a reconfigurable voltage controlled oscillator for supporting multi-mode applications.

BACKGROUND OF THE DISCLOSURE

The background description provided herein is for the purpose of generally presenting the context of the disclosure. Work of the inventors hereof, to the extent the work is described in this background section, as well as aspects of the description that may not otherwise qualify as prior art at the time of filing, are neither expressly nor impliedly admitted as prior art against the present disclosure.

Wireless communication technologies are constantly evolving leading to improvements in new wireless standards for communicating data. For example, multiple wireless standards, such as GSM, W-CDMA, and LTE, have improved one over another in delivering higher data rates and better quality of service. Each of these standards co-exists with one another providing users with wireless coverage throughout the world. However, each of these wireless standards operate at different frequency bands.

Wireless clients need to support each of these frequency bands in order to support the different wireless standards. Voltage controlled oscillators (VCO) are an important component of a multi-standard wireless client, which are used for handling and generating signals in different frequency bands. In order to support multiple frequency bands, multiple VCOs are typically used. However, minimizing the amount of additional hardware is critical in a wireless client, since as the number of wireless standards increase, adding hardware for each of these standards becomes prohibitive in terms of cost and area. In designing a VCO, design constraints such as, cost, area, power consumption, and phase noise need to be considered. Therefore, it is difficult to design a VCO which meets all the required constraints while also supporting multiple frequency bands.

SUMMARY OF THE DISCLOSURE

In accordance with an embodiment of the disclosure, a circuit is provided for using a reconfigurable voltage controlled oscillator to support multi-mode applications. A voltage control oscillator circuit comprises a resonant circuit, a first oscillator circuitry coupled to the resonant circuit, and a second oscillator circuitry coupled to the resonant circuit. The voltage control oscillator circuit further comprises switching circuitry configured to select, based on an operating metric, one of the first oscillator circuitry and the second oscillator circuitry for providing an output voltage.

In certain implementations, the operating metric comprises maximum power consumption, maximum current required, and minimum phase noise.

In certain implementations, the first oscillator circuitry comprises NMOS transistors and the second oscillator circuitry comprises PMOS transistors and NMOS transistors.

In certain implementations, the first oscillator circuitry and the second oscillator circuitry share a plurality of transistors.

In certain implementations, the first oscillator circuitry comprises a plurality of NMOS transistors cross coupled together. The second oscillator circuitry comprises a plurality of PMOS transistors cross coupled together and the plurality of NMOS transistors of the first oscillator circuitry cross coupled together.

In accordance with another embodiment of the disclosure, a method is provided for using a reconfigurable voltage controlled oscillator to support multi-mode applications. Control circuitry is used to determine an operating metric, and switching circuitry is used to select one of a first oscillator circuitry and a second oscillator circuitry to provide an output voltage based on the determined operating metric. The first oscillator circuitry and the second oscillator circuitry are coupled together to a resonant circuit, and an output voltage is provided based on the selected first and second oscillator circuitry.

BRIEF DESCRIPTION OF THE DRAWINGS

Further features of the disclosure, its nature and various advantages will be apparent upon consideration of the following detailed description, taken in conjunction with the accompanying drawings, in which like reference characters refer to like parts throughout, and in which.

DETAILED DESCRIPTION

To provide an overall understanding of the disclosure, certain illustrative embodiments will now be described. However, the systems and methods described herein may be adapted and modified as is appropriate for the application being addressed and that the systems and methods described herein may be employed in other suitable applications, and that such other additions and modifications will not depart from the scope hereof.

Designing a reconfigurable VCO provides a way to support multiple frequency bands while minimizing the cost and area utilized by using multiple oscillators. However, no VCO, which is capable of supporting multiple wireless standards, such as W-CDMA and GSM, has been shown that is also competitive with the power consumption achieved using separate VCO. In fact, the very demanding GSM phase noise specifications require a current up to four times higher, depending on the duplexer selectivity, than that used in the W-CDMA case, which makes designing a VCO with supports multiple frequency bands difficult.

In the design of oscillators using resonant circuits, such as inductor and capacitor (LC tank) resonant circuits, phase noise normalized to power consumption (i.e., figure of merit, FoM), reaches an optimum at the maximum oscillation amplitude compatible with a supply voltage VDD. This condition complicates the design of a reconfigurable VCO, since there is only one value of bias current yielding the highest FoM, once an LC tank and VDD are chosen. On the other hand, making the LC tank reconfigurable invariably results in a degradation of its Q factor. The Q factor is a metric which characterizes a resonator circuit. The Q factor describes the peak energy stored in a resonator circuit divided by the average energy dissipated in it per cycle at its resonance frequency. Low Q factor circuits are more damped and lossy in terms of energy, which reduces the quality of the resonator, and reduces the FoM of the oscillator.

The present disclosure describes a reconfigurable VCO which supports multiple frequency bands whose power consumption can be reconfigured while maintaining an almost constant FoM. The benefit is that the same optimized tank may be used, reducing area and cost, while minimizing the degradation of the Q factor of the resonator, and providing a method for switching the VCO topology from different types of oscillators. For example, using switching circuitry to switch between an N type VCO and a p-n type VCO within the same VCO topology. Although, an N type VCO and p-n type VCOs are described, other VCOs which include switching circuitry using similar techniques may be used.

Figure 1:
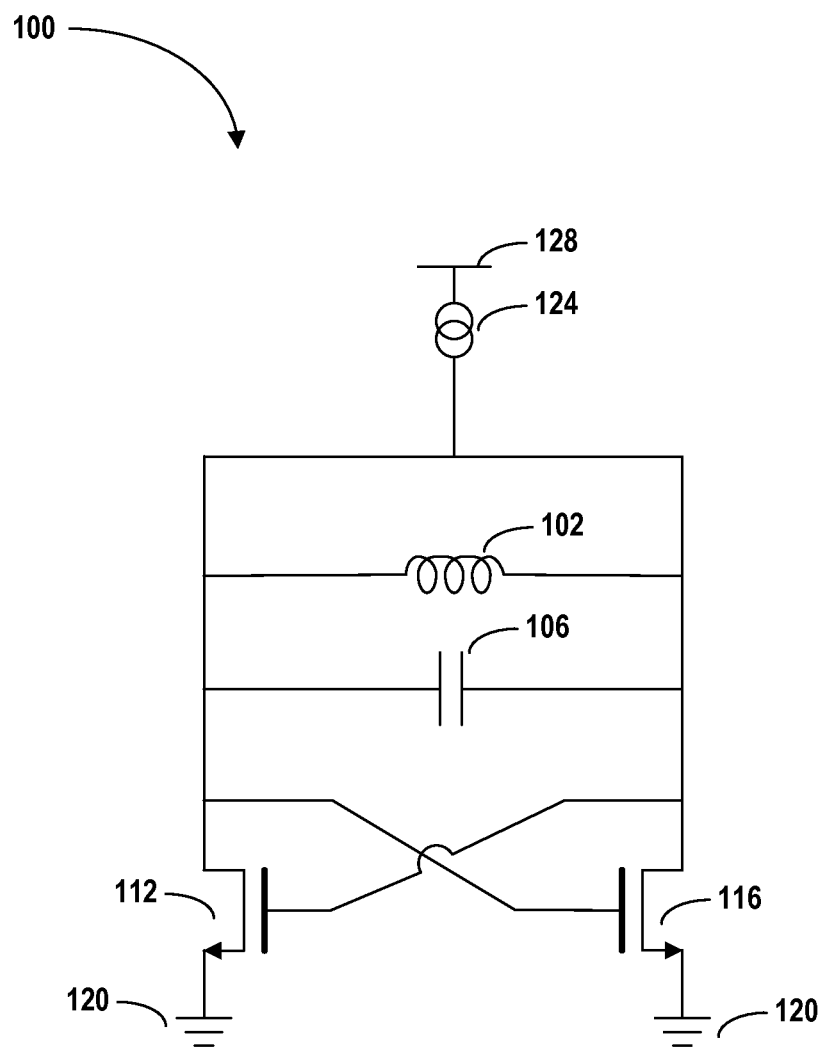
FIG. 1 shows an example of an n type voltage controlled oscillator according to an embodiment of the present disclosure.

FIG. 1 shows an example of an N type VCO 100. N type VCO 100 includes a resonator circuit, also called a tank, which includes inductor 102 and capacitor 106. Inductor 102 and capacitor 106 may include multiple components which set the inductance and capacitance value of inductor 102 and capacitor 106 respectively. As shown in FIG. 1, inductor 102 and capacitor 106 are coupled in parallel, however any configuration of inductor 102 and capacitor 106 may be provided in order to set the desired resonator properties, such as resonance frequency and Q factor. The Q factor of the resonator circuit is directly related to the inductance and capacitance value of inductor 102 and capacitor 106.

N type VCO 100 also includes NMOS transistors 112 and 116, which are cross coupled together. N type VCO 100 uses only NMOS type transistors 112 and 116 in its oscillator circuitry, which is why it is called an N type VCO 100. NMOS transistors 112 and 116 are coupled at the source to electrical ground 120. N type VCO 100 also includes a bias current generator 124 which is coupled to the oscillator and to VDD voltage 128.

Properties of N type VCO 100 are that it has low phase noise, however it consumes a lot of power. When high phase noise can be tolerated, the benefit of using N type VCO 100 is diminished, since power consumption is high. An alternative VCO to N type VCO 100 is a P-N type VCO, which is shown in FIG. 2.

Figure 2:
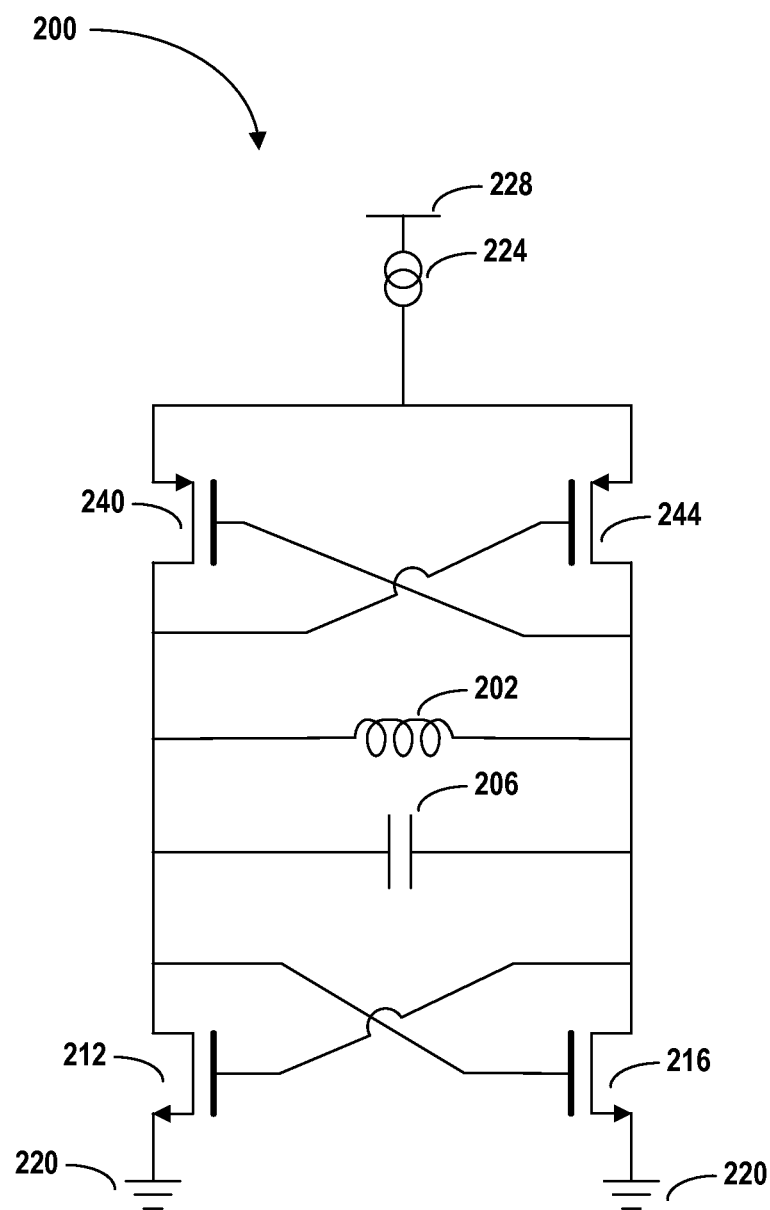
FIG. 2 shows an example of a p-n type voltage controlled oscillator according to an embodiment of the present disclosure.

FIG. 2 shows an example of a P-N type VCO 200. P-N type VCO 200 includes a resonator circuit, which includes inductor 202 and capacitor 206. Inductor 202 and capacitor 206 may include multiple components which set the inductance and capacitance value of inductor 202 and capacitor 206 respectively. As shown in FIG. 2, inductor 202 and capacitor 206 are coupled in parallel, however any configuration of inductor 202 and capacitor 206 may be provided in order to set the desired resonator properties, such as resonance frequency and Q factor. The Q factor of the resonator circuit is directly related to the inductance and capacitance value of inductor 202 and capacitor 206.

P-N type VCO 200 also includes NMOS transistors 212 and 216 and PMOS transistors 240 and 244, which are cross coupled together. Unlike N type VCO 100 which uses only NMOS type transistors in its oscillator circuitry, P-N type VCO 200 uses both NMOS and PMOS transistors. NMOS transistors 212 and 216 are coupled at the source to electrical ground 220 and PMOS transistors 240 and 244 are coupled at their source to bias current generator 224. P-N type VCO 100 also includes a current bias generator 224 which is coupled to the oscillator and to VDD voltage 228.

P-N type VCO 200 has a lower voltage amplitude oscillation as N type VCO 100. This results in a higher phase noise in P-N type VCO 200 than N type VCO 100 if the same tank is used. For example, for a given VDD voltage 128 and 228, inductor value 102 and 202, and capacitor value 106 and 206, the maximum amplitude oscillation in P-N type VCO 200 is half compared to N type VCO 100, resulting in a minimum phase noise 6 dB higher in P-N type VCO 200. However, P-N type VCO 200 has a double efficiency compared to N type VCO 100 and for the same phase noise draws half of the current, which means it consumes much less power. For the same resonator circuit values and VDD voltage, N type VCO 100 and P-N type VCO 200 have the same maximum FoM. By leveraging both N type 100 and P-N type 200 VCO topologies, a reconfigurable VCO may be realized which has multiple power consumption values, and multiple phase noise properties, with a constant FoM for whichever topology is selected. For example, N type VCO 100 may be used for the low phase noise constraint scenarios and P-N type VCO 200 may be used when a higher phase noise can be accepted.

Designing a reconfigurable VCO based on an N type VCO, such as VCO 100, and a P-N type VCO, such as VCO 200, is not trivial. For example, the PMOS transistors must be completely switched off when the N type VCO is selected or the Q factor of the resonator circuit may become seriously degraded, which would affect the efficiency of the reconfigurable VCO.

Figure 3:
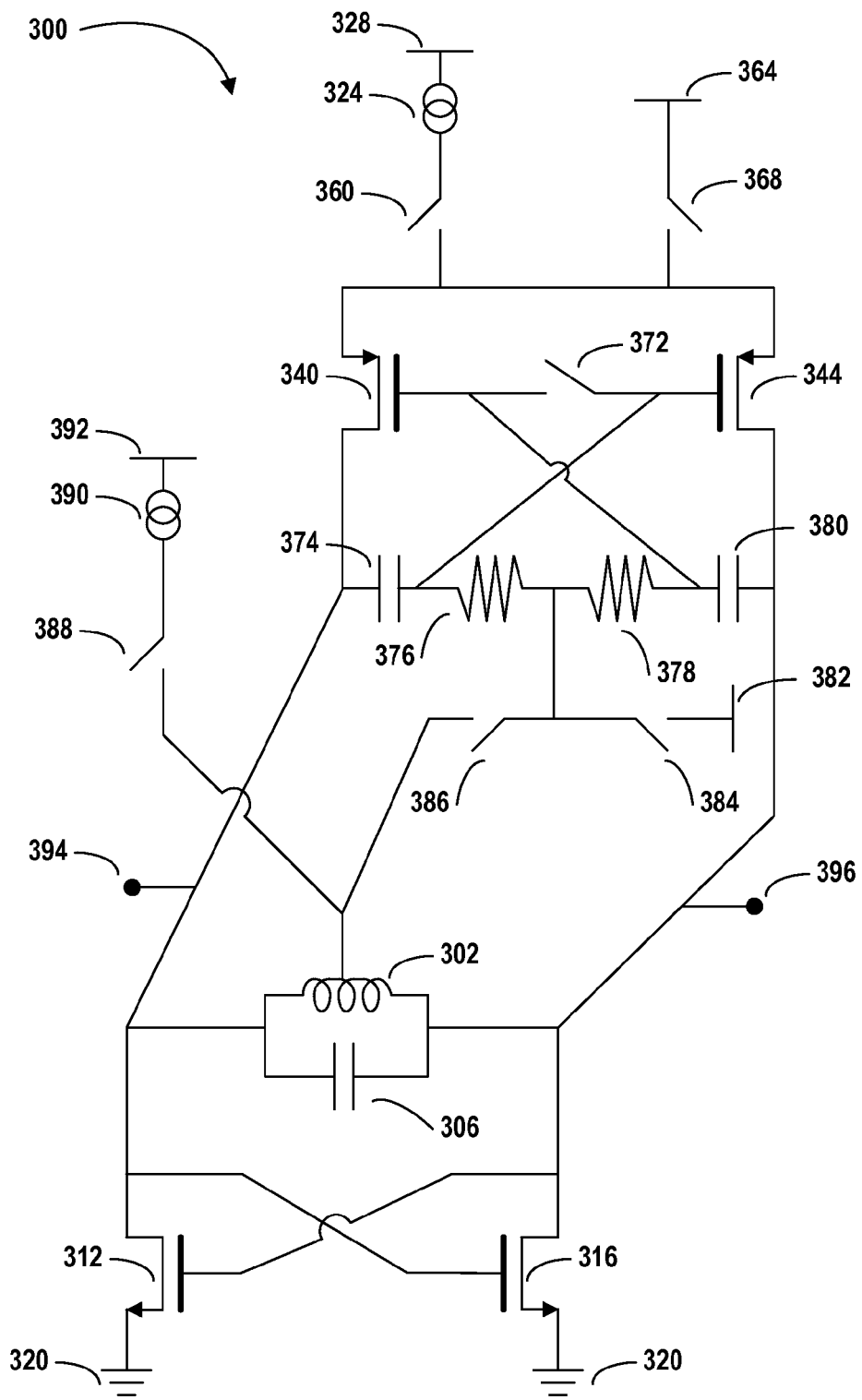
FIG. 3 shows an example of a reconfigurable voltage controlled oscillator according to an embodiment of the present disclosure.

FIG. 3 shows an example of an implementation of a reconfigurable VCO which efficiently combines multiple VCO topologies and provides switching circuitry which prevents degradation of the resonator circuit while providing a constant FoM.

FIG. 3 shows an example of a reconfigurable VCO 300. Reconfigurable VCO 300 includes cross coupled NMOS transistors 312 and 316, a resonant circuit which includes inductor 302 and 306, and PMOS transistors 340 and 344. NMOS transistors 312 and 316 have their sources coupled to electrical ground 320. Reconfigurable VCO 300 generates an oscillating voltage output at 394 and 396.

Switching circuitry 360, 368, 388, 386, 384, and 372, are used to switch between an N type VCO, such as VCO 100, and a P-N type VCO, such as VCO 200. Switching circuitry 360, 368, 388, 386, 384, and 372, may be implemented as transistor switches configured by a control signal generated by control circuitry. The switches may be configured and controlled by the control signals generated by the control circuitry based on an operating metric determined by the control circuitry. An operating metric may include a selected maximum power consumption, maximum current required, and minimum phase noise. Based on the determined operating metric, the control circuitry may generate control signals which configure the switching circuitry in the reconfigurable VCO to select one of the VCO topologies in the reconfigurable VCO. Switching circuitry may also be implemented in any other way which provides selectable electrical isolation between electrical connections. Capacitors 374 and 380, resistors 376 and 378, and switching circuitry 372, which are coupled to PMOS transistors 340 and 344, provide a tunable RC network which switches off the PMOS transistors 340 and 344 when the N type VCO is selected. Resistors 376 and 378 and capacitors 374 and 380 may be implemented using PMOS or NMOS transistors. PMOS transistors 340 and 344 are cross coupled through the tunable RC network. When switching circuitry 372 is opened or closed, a high pass cut-off frequency is set in the tunable RC network which turns off or turns on PMOS transistors 340 and 344. The switching circuitry and tunable RC network provides a mechanism to shut off PMOS transistors 340 and 344, preventing degradation of the resonant circuit.

Switching circuitry 360 and 386 is closed, and switching circuitry 368, 372, 384, and 388 is open, when reconfigurable VCO 300 is configured as a P-N type VCO. Switching circuitry 360 provides a connection to bias current generator 324 which is coupled to VDD voltage 328. Switching circuitry 386 coupled PMOS transistors 340 and 344 to the resonator circuit, which includes inductor 302 and capacitor 306.

Switching circuitry 368, 372, 384, and 388 is closed, and switching circuitry 360 and 386 is open, when reconfigurable VCO 300 is configured as a N type VCO. Switching circuitry 360 provides a connection from bias current generator 390, which is coupled to VDD voltage 392, to the resonator circuit, which includes inductor 302 and 306. Switching circuitry 384 and 368 provide connections to VDD voltages 364 and 382, which along with switching circuitry 372 and the tunable RC network, switch off PMOS transistors 340 and 344.

Figure 4:
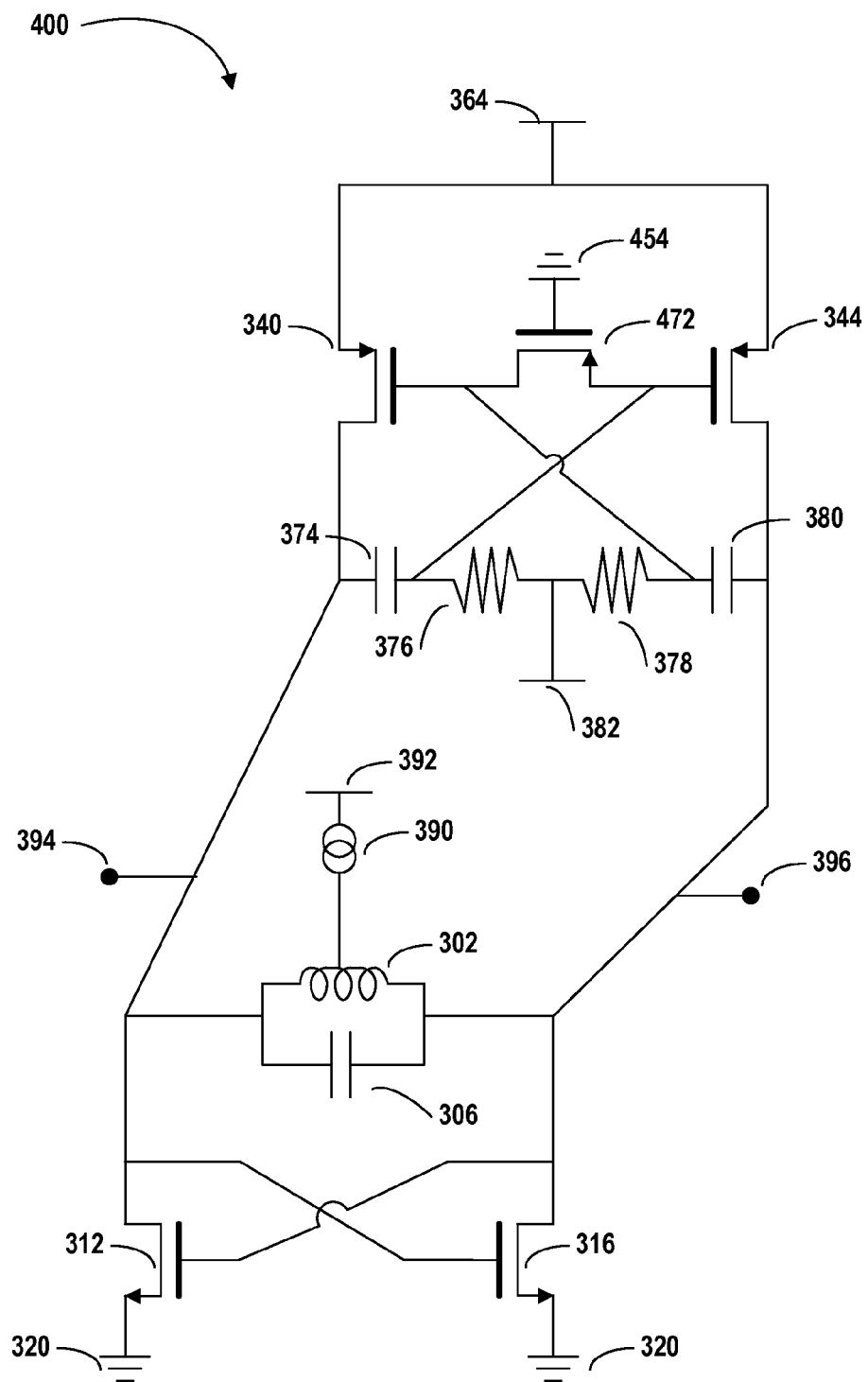
FIG. 4 shows an example of a selected configuration of a reconfigurable voltage controlled oscillator according to an embodiment of the present disclosure.

FIG. 4 shows an example of a selected configuration 400 of a reconfigurable 300 in an N type VCO configuration. Switching circuitry 368, 372, 384, and 388 are closed and switching circuitry 360 and 386 are opened in FIG. 4. Switching circuitry 472 a PMOS switch shown as an implementation of switching circuitry 372. Switching circuitry 472 has electrical ground coupled to the gate of the PMOS in order to enable the PMOS transistor, effectively closing the switch.

In the N type VCO configuration of reconfigurable VCO 400, both sources and gates of PMOS transistors 340 and 344 are biased to VDD and switching circuitry 472 is closed. In this case, the drains and gates of PMOS transistors 340 and 344 are AC coupled through the tunable RC network. This configures the tunable RC network to have a high-pass cut-off frequency which creates sufficient attenuations between the VCO outputs and PMOS transistors 340 and 344, thereby keeping them switched off. The high-pass cut-off frequency in this configuration may be given by 2/(C*Ron), where Ron is the on-resistance of the PMOS transistors of switching circuitry 472 and C is the capacitance value of the tunable RC network. Ron should be configured to be small enough to provide sufficient attenuation above the oscillating frequency of selected VCO configuration 400.

Figure 5:
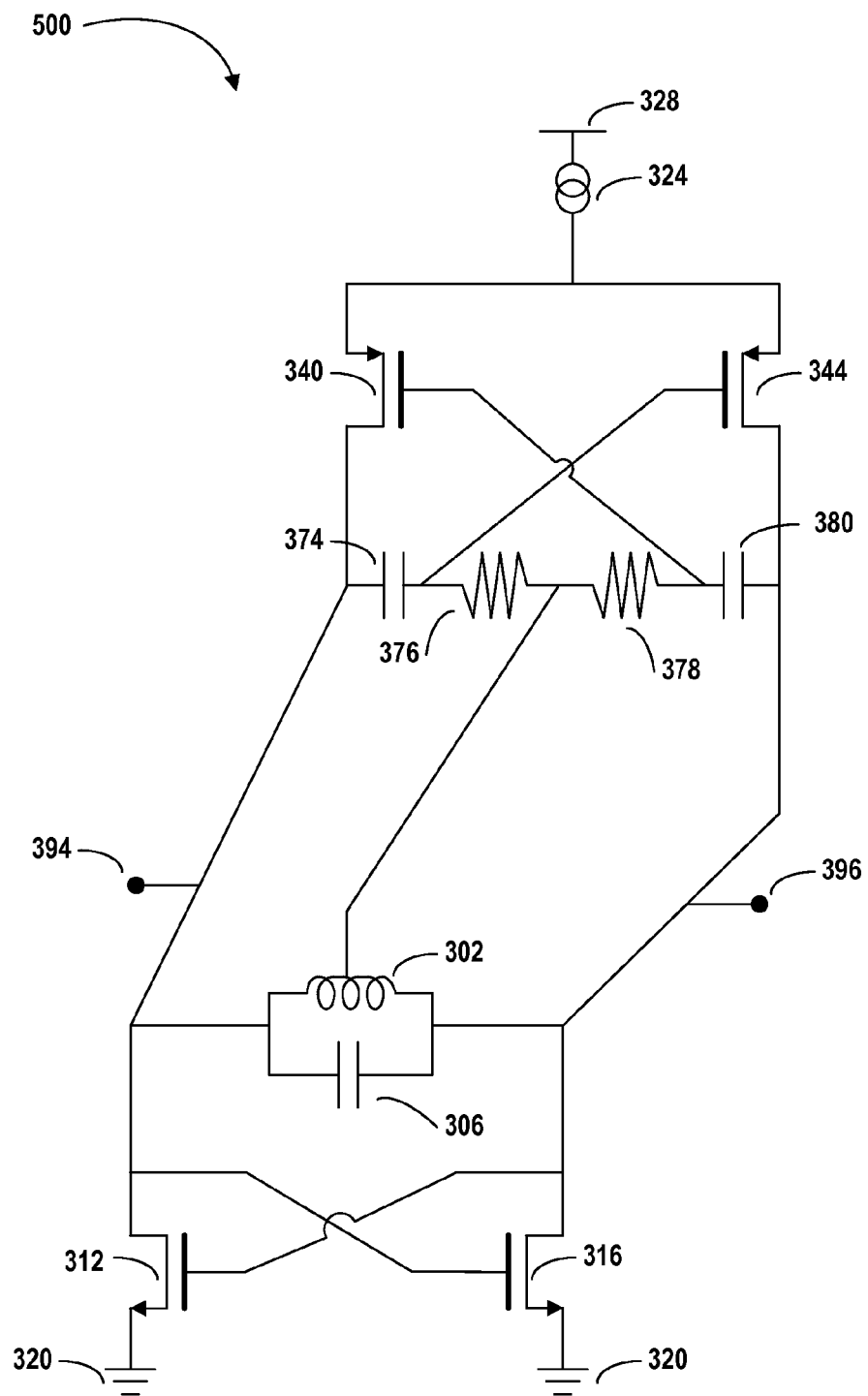
FIG. 5 shows an example of another selected configuration of a reconfigurable voltage controlled oscillator according to an embodiment of the present disclosure.

FIG. 5 shows an example of a selected configuration 500 of a reconfigurable 300 in a P—N type VCO configuration. Switching circuitry 368, 372, 384, and 388 are opened and switching circuitry 360 and 386 are closed in FIG. 5.

In the P—N type VCO configuration of reconfigurable VCO 500, switching circuitry 372 is opened and switching circuitry 386 is closed, coupling PMOS transistors 340 and 344 to the resonant circuit. PMOS transistors 340 and 344 are coupled to the resonant circuit through resistors 376 and 378. The tunable RC network needs to be configured to decrease the high-pass cut-off frequency of the tunable RC network well below the oscillator frequency to ensure proper operation of PMOS transistors without degrading the resonator circuit. The high-pass cut-off frequency in this configuration may be given by 1/(C*Rb), where Rb is the resistance of resistors 376 and 378 and C is the capacitance value of the tunable RC network. Rb should be configured to be large enough to make the high-pass cut-off frequency substantially less than the oscillator frequency of the selected VCO configuration 500.

Figure 6:
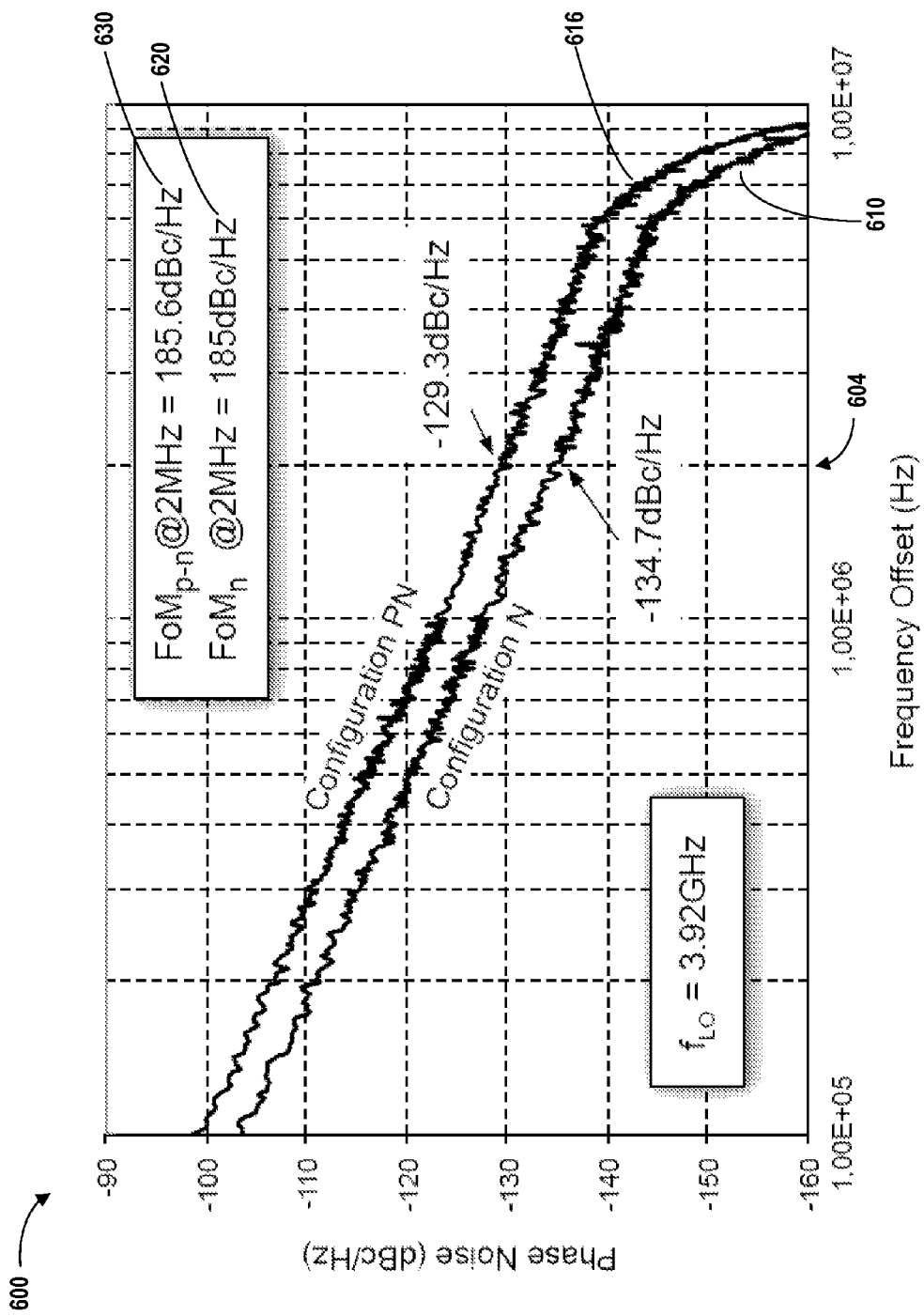
FIG. 6 shows a graph of the performance characteristics of a reconfigurable voltage controlled oscillator according to an embodiment of the present disclosure.

FIG. 6 shows a graph 600 of the performance characteristics of a reconfigurable VCO 300. Graph 600 shows phase noise versus frequency offset from the oscillator frequency $f_{LO}$ of reconfigurable VCO 300. At a 2 MHZ frequency offset 604, the phase noise 616 for the P-N type configuration 500 and the phase noise 610 for the N type configuration 400 is shown. At the frequency offset of 2 MHz at 604, the phase noise is −129.3 dBc/Hz and −134.7 dBc/Hz for the P-N type configuration 500 and N type configuration 400 respectively. Since the N type configuration 400 uses four times more current than the P-N Type configuration 500 at maximum efficiency, the FoMs are almost the same between the two configurations. The FoM for the P-N type configuration 500 is 185.6 dBc/Hz and the FoM for the N type configuration 400 is 185 dBc/Hz. This shows that reconfigurable VCO 300 provides an almost constant FoM while allowing for reconfiguration of power consumption, phase noise, and current, while sharing the same resonator circuit.

Figure 7:
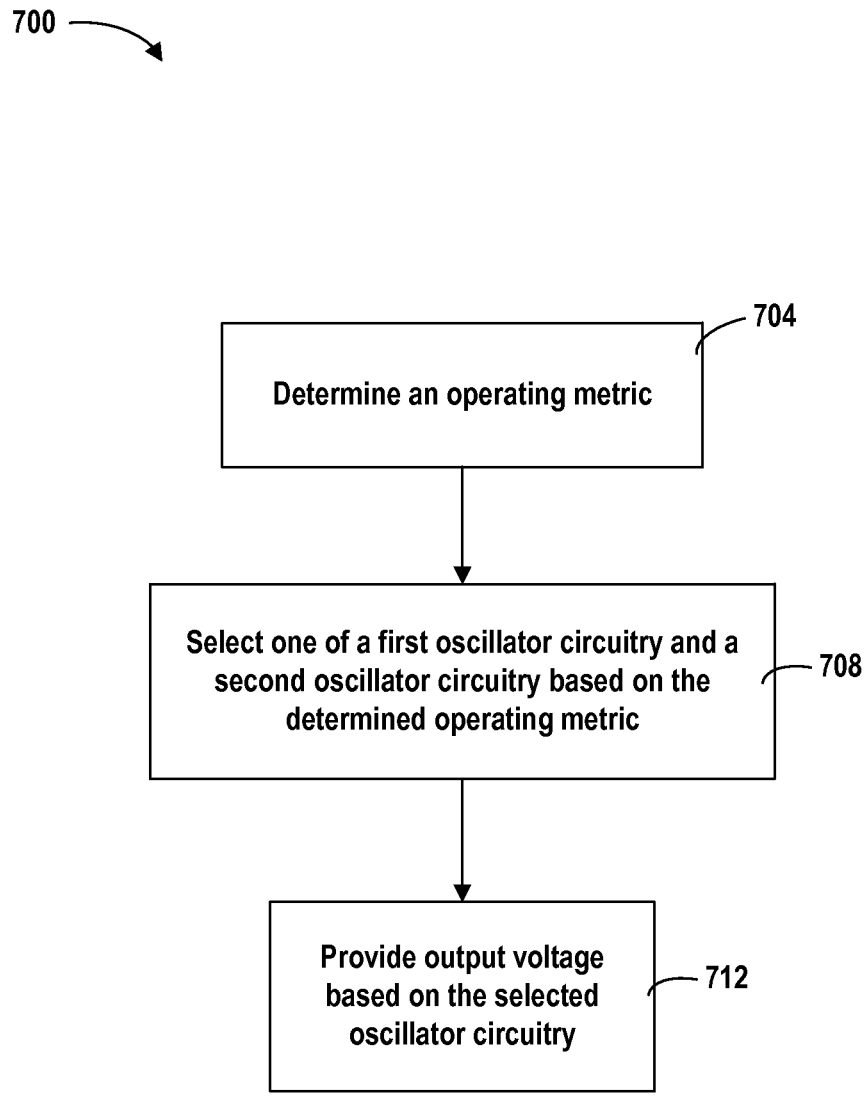
FIG. 7 shows an illustrative process for selecting a configuration of a reconfigurable voltage controlled oscillator according to an embodiment of the present disclosure.

FIG. 7 shows an illustrative process 700 for selecting a configuration of a reconfigurable VCO, such as reconfigurable VCO 300. At 704, an operating metric is determined using control circuitry. An operating metric may include a selected maximum power consumption, maximum current required, and minimum phase noise. At 708, based on the determined operating metric, the control circuitry may generate control signals which configure the switching circuitry in the reconfigurable VCO to select one of a plurality of implemented VCO topologies in the reconfigurable VCO. For example, in reconfigurable VCO 300, based on the determined operating metric, the N type VCO 400 or the P-N type VCO 500 may be selected.

The selection circuitry may configure the tunable RC network within VCO 300, which configures the high-pass cut-off frequency of the tunable RC network. This allows the PMOS transistors, such as PMOS transistors 340 and 344 in VCO 300, to be turned off or on depending on the topology used. At 712, once the selected VCO configuration is selected, the reconfiguration VCO 300 may provide the oscillator output voltage.

The above described embodiments of the present disclosure are presented for purposes of illustration and not of limitation, and the present disclosure is limited only by the claims which follow.

What is claimed is:
1. A voltage control oscillator circuit, the circuit comprising:
   a resonant circuit;
   first oscillator circuitry coupled to the resonant circuit;
   second oscillator circuitry coupled to the resonant circuit;
   a tunable RC high pass circuitry; and
   switching circuitry configured to select, based on an operating metric, one of the first oscillator circuitry and the second oscillator circuitry for providing an output voltage, wherein:

when the first oscillator circuitry is selected, the tunable RC high pass circuitry has a cut-off frequency higher than an oscillator frequency of the voltage controlled oscillator circuit, and when the second oscillator circuitry is selected, the tunable RC high pass circuitry has a cut-off frequency lower than the oscillator frequency of the voltage controlled oscillator circuit.

2. The circuit of claim 1, wherein the operating metric comprises maximum power consumption, maximum current required, and minimum phase noise.

3. The circuit of claim 1, wherein the resonant circuit comprises an inductor and a capacitor coupled together.

4. The circuit of claim 3, wherein the inductor and capacitor are coupled in parallel.

5. The circuit of claim 1, wherein the first oscillator circuitry comprises NMOS transistors and the second oscillator circuitry comprises PMOS transistors and NMOS transistors.

6. The circuit of claim 1, wherein the first oscillator circuitry is configured to have a greater maximum power consumption than the second oscillator circuitry.

7. The circuit of claim 1, wherein the first oscillator circuitry and the second oscillator circuitry share a plurality of transistors.

8. The circuit of claim 1, wherein the first oscillator circuitry comprises a plurality of NMOS transistors cross coupled together, and the second oscillator circuitry comprises:
 a plurality of PMOS transistors cross coupled together; and
 the plurality of NMOS transistors of the first oscillator circuitry cross coupled together.

9. The circuit of claim 8,
 wherein the switching circuitry AC couples the plurality of PMOS transistors of the second oscillator circuitry to the resonant circuit through the tunable RC high pass circuitry when the second oscillator circuitry is selected.

10. A method comprising:
 determining, using control circuitry, an operating metric;
 selecting, using switching circuitry, one of a first oscillator circuitry and a second oscillator circuitry to provide an output voltage based on the determined operating metric, wherein the first oscillator circuitry and the second oscillator circuitry are coupled together to a resonant circuit, wherein:

when the first oscillator circuitry is selected, tunable RC high pass circuitry has a cut-off frequency higher than an oscillator frequency of a voltage controlled oscillator circuit comprising the first oscillator circuitry and the second oscillator circuitry, and when the second oscillator circuitry is selected, the tunable RC high pass circuitry has a cut-off frequency lower than an oscillator frequency of the voltage controlled oscillator circuit; and providing the output voltage based on the selected first and second oscillator circuitry.

11. The method of claim 10, wherein the operating metric comprises maximum power consumption, maximum current required, and minimum phase noise.

12. The method of claim 10, wherein the resonant circuit comprises an inductor and a capacitor coupled together.

13. The method of claim 12, wherein the inductor and capacitor are coupled in parallel.

14. The method of claim 10, wherein the first oscillator circuitry comprises NMOS transistors and the second oscillator circuitry comprises PMOS transistors and NMOS transistors.

15. The method of claim 10, wherein the first oscillator circuitry has a greater maximum power consumption than the second oscillator circuitry.

16. The method of claim 10, wherein the first oscillator circuitry and the second oscillator circuitry share a plurality of transistors.

17. The method of claim 10, wherein the first oscillator circuitry comprises a plurality of NMOS transistors cross coupled together, and the second oscillator circuitry comprises:
 a plurality of PMOS transistors cross coupled together; and
 the plurality of NMOS transistors of the first oscillator circuitry cross coupled together.

18. The method of claim 17, wherein selecting one of the first oscillator circuitry and the second oscillator circuitry comprises:
 AC coupling the plurality of PMOS transistors of the second oscillator circuitry to the resonant circuit through the tunable RC high pass circuitry when the second oscillator circuitry is selected.

* * * * *